(12) United States Patent
Nakayama

(10) Patent No.: US 11,004,522 B2
(45) Date of Patent: May 11, 2021

(54) FAIL BIT NUMBER COUNTING CIRCUIT AND NON-VOLATILE SEMICONDUCTOR STORAGE DEVICE

(71) Applicant: Powerchip Semiconductor Manufacturing Corporation, Hsinchu (TW)

(72) Inventor: Akitomo Nakayama, Tokyo (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/796,957

(22) Filed: Feb. 21, 2020

(65) Prior Publication Data

US 2020/0395085 A1    Dec. 17, 2020

(30) Foreign Application Priority Data

Jun. 12, 2019  (JP) .............................. JP2019-109833

(51) Int. Cl.
| | |
|---|---|
| *G11C 16/04* | (2006.01) |
| *G11C 16/34* | (2006.01) |
| *G11C 16/26* | (2006.01) |
| *G11C 16/10* | (2006.01) |
| *G11C 16/30* | (2006.01) |
| *G11C 29/04* | (2006.01) |
| *H03K 23/40* | (2006.01) |

(52) U.S. Cl.
CPC .............. *G11C 16/34* (2013.01); *G11C 16/10* (2013.01); *G11C 16/26* (2013.01); *G11C 16/30* (2013.01); *G11C 29/04* (2013.01); *H03K 23/40* (2013.01); *G11C 16/0483* (2013.01)

(58) Field of Classification Search
CPC ........................................................ G11C 29/04
USPC .................................................... 365/185.12
See application file for complete search history.

(56) References Cited

U.S. PATENT DOCUMENTS

2012/0155186 A1*  6/2012  Chokan .............. G11C 16/0483
                                                              365/185.22

FOREIGN PATENT DOCUMENTS

| JP | H09147582 | 6/1997 |
|---|---|---|
| JP | 2000285692 | 10/2000 |
| JP | 2001028575 | 1/2001 |
| JP | 2002140899 | 5/2002 |
| JP | 2002197898 | 7/2002 |
| JP | 2003346485 | 12/2003 |

* cited by examiner

*Primary Examiner* — Hoai V Ho
(74) *Attorney, Agent, or Firm* — JCIPRNET

(57) ABSTRACT

A fail bit number counting circuit includes a data transfer circuit configured by a series circuit in which switch elements turned on for calculation result data indicating a pass bit from each page buffer portion and turned off for calculation result data indicating a fail bit are connected in series; a control circuit inputs a counting enable signal to one input terminal of the data transfer circuit, and sequentially transfers the counting enable signal till the next switch element being turned off via the series circuit corresponding to a clock with a prescribed cycle; and the fail bit number counting circuit includes a clock counter by which the number of clocks till the counting enable signal reaches the other output terminal of the data transfer circuit after the counting enable signal is input to one input terminal of the data transfer circuit is counted as a fail bit number.

8 Claims, 16 Drawing Sheets

FAIL BIT NUMBER COUNTING CIRCUIT AND NON-VOLATILE SEMICONDUCTOR STORAGE DEVICE

CROSS-REFERENCE TO RELATED APPLICATION

This application claims the priority benefit of Japan application serial no. 2019-109833, filed on Jun. 12, 2019. The entirety of the above-mentioned patent application is hereby incorporated by reference herein and made a part of this specification.

BACKGROUND OF THE DISCLOSURE

Technical Field

The disclosure relates to a fail bit number counting circuit for an electrically rewritable non-volatile semiconductor storage device (EEPROM (electrically erasable programmable read-only memory)) such as a flash memory and the like, and to a non-volatile semiconductor storage device equipped with the fail bit number counting circuit.

Related Art

A NAND type non-volatile semiconductor storage device is known in which a plurality of memory cell transistors (hereinafter referred to as memory cells) are connected in series between a bit line and a source line to constitute a NAND string and achieve a high integration (for example, see patent literatures 1-4).

In an EEPROM flash memory, particularly in an NAND type flash memory, data writing and data reading are usually performed in a page unit and thereby high-speed data writing and data reading can be performed effectively, and data erasure is usually performed in a block unit including a plurality of pages and thereby high-speed data erasure can be performed. Since the NAND type flash memory is loaded with an error correcting code (ECC) circuit, even if an error is generated during reading and writing operations, the error can be corrected by the error correcting code circuit that is loaded, and thus a correctable fail bit number is included.

The NAND type flash memory includes an array consisting of a plurality of array blocks or memory blocks; generally, the array includes acceptable bad blocks and the bad blocks are substantially not used. When a test operation is performed on a packaged or finished NAND type flash memory device before shipment, the memory device is discarded when it is determined as a memory device in which at least one of normal array blocks of the array includes fail bits. If the number of fail bits of the array block found in the test operation does not exceed the correctable fail bit number, the NAND type flash memory including the bad blocks determined in the test operation can use the error correcting code circuit and thereby improve the yield.

In view of this, a method is proposed in which a fail bit counting circuit connected to a page buffer is arranged to count the fail bit number at a shorter time (for example, see patent literature 5).

In addition, in patent literature 6, a counting method of fail bit number for correctly counting the number of fail bits generated in a process of programming data or reading data in the non-volatile semiconductor storage device and for improving the yield is proposed. In the counting method of fail bit number, a fail bit detection block operates corresponding to a fail bit detection command signal, determines whether the data bits selected by a column selection circuit include fail bits, and outputs a fail flag signal complying with the determination result. A fail bit counter and a latch block count the number of the fail bits with respect to the data bits stored in a row of memory cells selected corresponding to the fail flag signal, and store a fail code indicating the counted number of the fail bits. A data output buffer block reads out the fail code and synchronizes the fail code to an enable signal between activation intervals of a fail bit reading command signal, and outputs the fail code outside through an input-output pin.

FIG. 1 is a block diagram showing configurations of a page buffer 201 and a fail bit detection circuit used in a NAND type flash memory of a conventional example.

The circuit of FIG. 1 includes MOS transistors Q201-Q206 and an inverter 202 which is a fail judgment circuit, and a current source 203 permitting the flowing of a reference current iRef (n+0.5) which is a threshold current. Herein, n is a pseudo judgment set value (a natural number). A voltage corresponding to data from the page buffer 201 is applied to a gate of the MOS transistor Q203, and a prescribed bias voltage JDG is applied to a gate of the MOS transistor Q204. The MOS transistors Q201, Q202 constitute a current mirror circuit, and a detection current iPB corresponding to data of a page buffer circuit 20 flows from the MOS transistor Q201 toward the MOS transistors Q203, Q204, and a current corresponding to the detection current iPB flows to the MOS transistor Q202. On the other hand, a current corresponding to the reference current iRef (n+0.5) flowing to the MOS transistor Q206 flows to the MOS transistor Q205; based on a voltage at a detection point T1 generated based on the current flowing from the MOS transistor Q202 toward the MOS transistor Q205, the inverter 202 which is a judgment circuit outputs calculation result data (hereinafter referred to as CR data) RESULT indicating a pass bit or fail bit.

Herein, for example, the MOS transistor Q204 around the page buffer 201 affects the chip size, and thus the MOS transistor Q204 is designed as small as possible, and the size of the MOS transistor Q202 is determined depending on the specification.

LITERATURE OF RELATED ART

Patent Literature

[Patent literature 1] Japanese Laid-Open No. 9-147582.
[Patent literature 2] Japanese Laid-Open No. 2000-285692.
[Patent literature 3] Japanese Laid-Open No. 2003-346485.
[Patent literature 4] Japanese Laid-Open No. 2001-028575.
[Patent literature 5] Japanese Laid-Open No. 2002-140899.
[Patent literature 6] Japanese Laid-Open No. 2002-197898.

SUMMARY

It takes a lot of time to confirm the data of all the page buffers (output of the page buffer 201 of FIG. 1) by a normal reading operation, and a counter circuit which is connected to a data bus for processing the above data is also required, and thus the counter circuit is configured by an analog operation method in which a normal wiring connected in common to all the page buffers is used. In this case, the analog operation is affected by noises or element variations. In addition, the number of the page buffers 201 is very large and the transistor size is very small, and thus it is necessary to check the current effect caused by the variations. Additionally, because the method is affected by noises, there is a problem that other operations are not performed in parallel at the same timing and the operation time increases accordingly. Furthermore, because the fail bit detection circuit is an analog circuit, there is a problem that the detection accuracy is often not sufficient for the specification.

The disclosure solves the above problems and provide a fail bit number counting circuit capable of operating with higher accuracy and higher speed compared with a conventional technology, and a non-volatile semiconductor storage device equipped with the fail bit number counting circuit.

A fail bit number counting circuit for non-volatile semiconductor storage device of one aspect of the disclosure includes:
a non-volatile memory cell array consisting of a plurality of memory cells; and a control circuit which controls writing of data consisting of a plurality of segments into the memory cell array via a page buffer and reading of data from the memory cell array via the page buffer, and counts the number of fail bits generated during the writing or the reading;
the page buffer is divided into a plurality of page buffer portions with a prescribed capacity for outputting calculation result data (CR data) indicating a pass bit or fail bit;
the fail bit number counting circuit includes a data transfer circuit configured by a series circuit in which a plurality of switch elements that are turned on for the CR data indicating a pass bit from each of the page buffer portion and are turned off for the CR data indicating a fail bit is connected in series;
the control circuit inputs a counting enable signal to one input terminal of the data transfer circuit, and sequentially transfers the counting enable signal till the next switch element being turned off via the series circuit corresponding to a clock with a prescribed cycle; and
the fail bit number counting circuit includes a clock counter, by which the number of the clocks till the counting enable signal reaches the other output terminal of the data transfer circuit after the counting enable signal is input to one input terminal of the data transfer circuit is counted as a fail bit number.

Therefore, according to the fail bit number counting circuit of the disclosure, a fail bit number counting circuit capable of operating with higher accuracy and higher speed compared with a conventional technology is provided.

DESCRIPTION OF THE EMBODIMENTS

In the following, embodiments of the disclosure are described with reference to the diagrams. Besides, identical symbols are added to identical or similar components.

Figure 1:
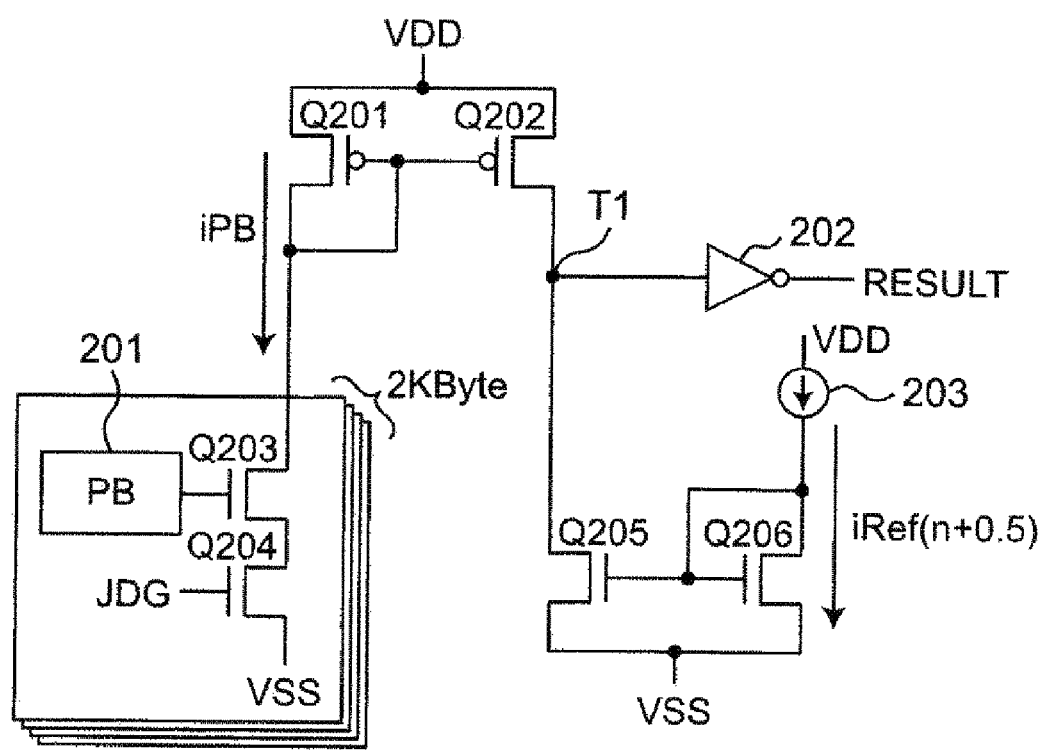
FIG. 1 is a block diagram showing configurations of a page buffer and a fail bit detection circuit used in a NAND type flash memory of a conventional example.
Figure 2:
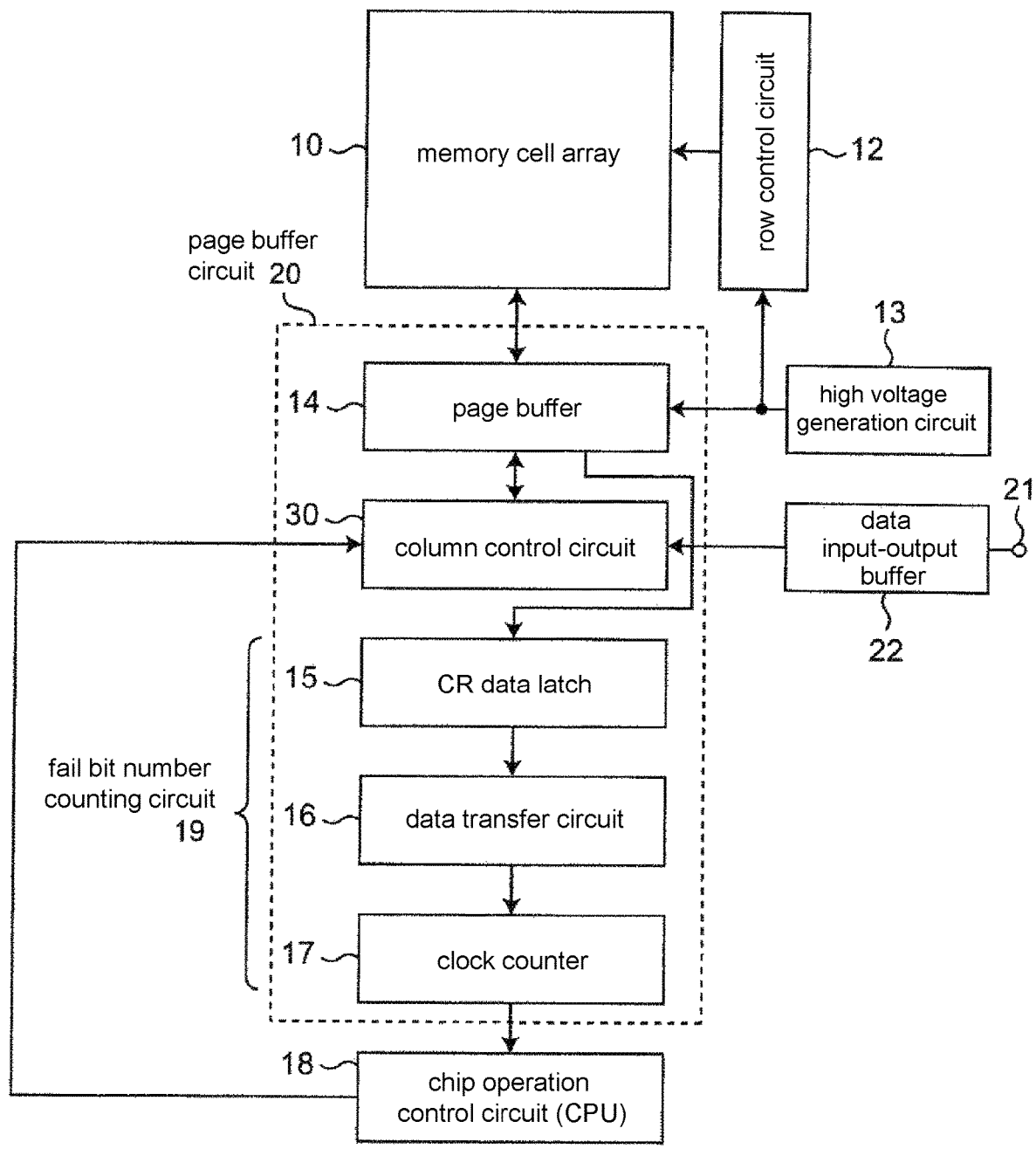
FIG. 2 is a block diagram showing a configuration example of the NAND type flash memory of an embodiment.

FIG. 2 is a block diagram showing a configuration of a NAND type flash memory of an embodiment.

In FIG. 2, the NAND type flash memory of this embodiment includes: a chip operation control circuit 30 which controls a chip operation of the NAND type flash memory; a memory cell array 10; a chip operation control circuit 18 which is configured by a CPU (a central processing unit) for controlling an operation of NAND type flash memory and a row control circuit 12; a high voltage generation circuit 13 which generates a program voltage and the like; a page buffer circuit 20 including data rewriting, data reading and data latching; a data input-output buffer 22 which temporarily stores data input and output via an input-output terminal 21; a fuse control circuit (not shown) which controls data of a fuse area in the memory cell array 10; and a fuse register (not shown) which temporarily stores the data of a fuse area. Herein, the page buffer circuit 20 includes a page buffer 14, a column control circuit 30, a CR data latch 15, a data transfer circuit 16, and a clock counter 17. Besides, the CR data latch 15, the data transfer circuit 16, and the clock counter 17 constitute a fail bit number counting circuit 19.

In the memory cell array 10, a plurality of non-volatile memory cells which have a stacked gate structure and which are electrically rewritable is connected in series and a NAND cell unit is formed. The range of the memory cells selected by one word line is one page which is a unit of writing and reading. The range of a plurality of NAND cell units with a range of one page or integer multiples of one page is one block which is a unit of data erasure. The page buffer 14 is a rewriting and reading circuit and includes a sense amplifier circuit and a latch circuit arranged for each bit line to perform data writing and reading of a page unit.

Herein, the memory cell array 10 has a simplified configuration and may share a page buffer by a plurality of bit lines. In this case, the number of bit lines selectively connected to the page buffer during data writing or reading operation is a unit of one page. In addition, the range of the cell array for input and output of data between the cell array and one input-output terminal 21 is shown. The row control circuit 12 including a row decoder and the column control circuit 30 including a column decoder are respectively arranged to select the word lines and bit lines of the memory cell array 10. The column control circuit 30 is controlled by the chip operation control circuit 18 consisting of a CPU, and the fail bit number counting circuit 19 which counts the fail bit number in each area with a prescribed data length is connected to the column control circuit 30; the column control circuit 30 controls a sequence of writing and erasure of data from the data input-output buffer 22 and data reading to the data input-output buffer 22. In addition, the high voltage generation circuit 13 generates a boosted high voltage or middle voltage used in data rewriting, erasure, and reading.

In FIG. 2, the data input-output buffer 22 is used in input and output of data and input of address signals. That is, data transfer is performed between the input-output terminal 21 and the page buffer 14 via the data input-output buffer 22, the data line and the column control circuit 30. The address signal input from the input-output terminal 21 is held in an address register in the column control circuit 30 and is sent to the column decoders in the row control circuit 12 and the column control circuit 30 to be decoded. An operation control command is also input from the input-output terminal 21. The command that is input is decoded and is held in a prescribed command register, and thereby the column control circuit 30 is controlled. In addition, various external control signals are taken into the chip operation control circuit 18, and internal control signals are generated corresponding to an operation mode. The internal control signals are used to control data latching, data transfer and the like in the data input-output buffer 22, and the internal control signals are further sent to the column control circuit 30 to perform an operation control.

In FIG. 2, the page buffer 14 is connected to the CR data latch 15. Data of the page buffer (hereinafter referred to as PB data) indicating a pass bit or fail bit in each memory cell of the memory cell array 10 judged by the page buffer 14 is temporarily stored as an initial value for each clock CLB in the CR data latch 15, and after that, the CR data that is stored changes based on the transfer data from the previous stage. As described later in detail with reference to Table 1, based on the CR data stored in the CR data latch 15 and the data from the previous stage, i.e., the transfer data from the data transfer circuit 16 or PBC data (data corresponding to the PB data and having the same value as the value of the PB data; besides, the data transmitted from the data transfer circuit 16 of self-stage to the data transfer circuit 16 of the next stage is the transfer data from the data transfer circuit 16 from the previous stage or the PBC data of self-stage, but for convenience of description, the data is collectively referred to as "transfer data"), the data transfer circuit 16 of self-stage calculates and determines the data (either the transfer data or the PBC data) to be transmitted to the next stage and transmits the data to the data transfer circuit 16 of the next stage. Then, a counting-up signal CNTUPB is transferred to the clock counter 17 by the data transfer circuit 16 after clocks CLKB with a number corresponding to the fail number, and the fail bit number is shown by the clock number counted by the clock counter 17. The fail bit number is transferred to the chip operation control circuit 18 which is a CPU and the total fail bit number is counted. Besides, the clock CLKB is a clock signal that is repeated with a prescribed cycle.

Figure 3A:
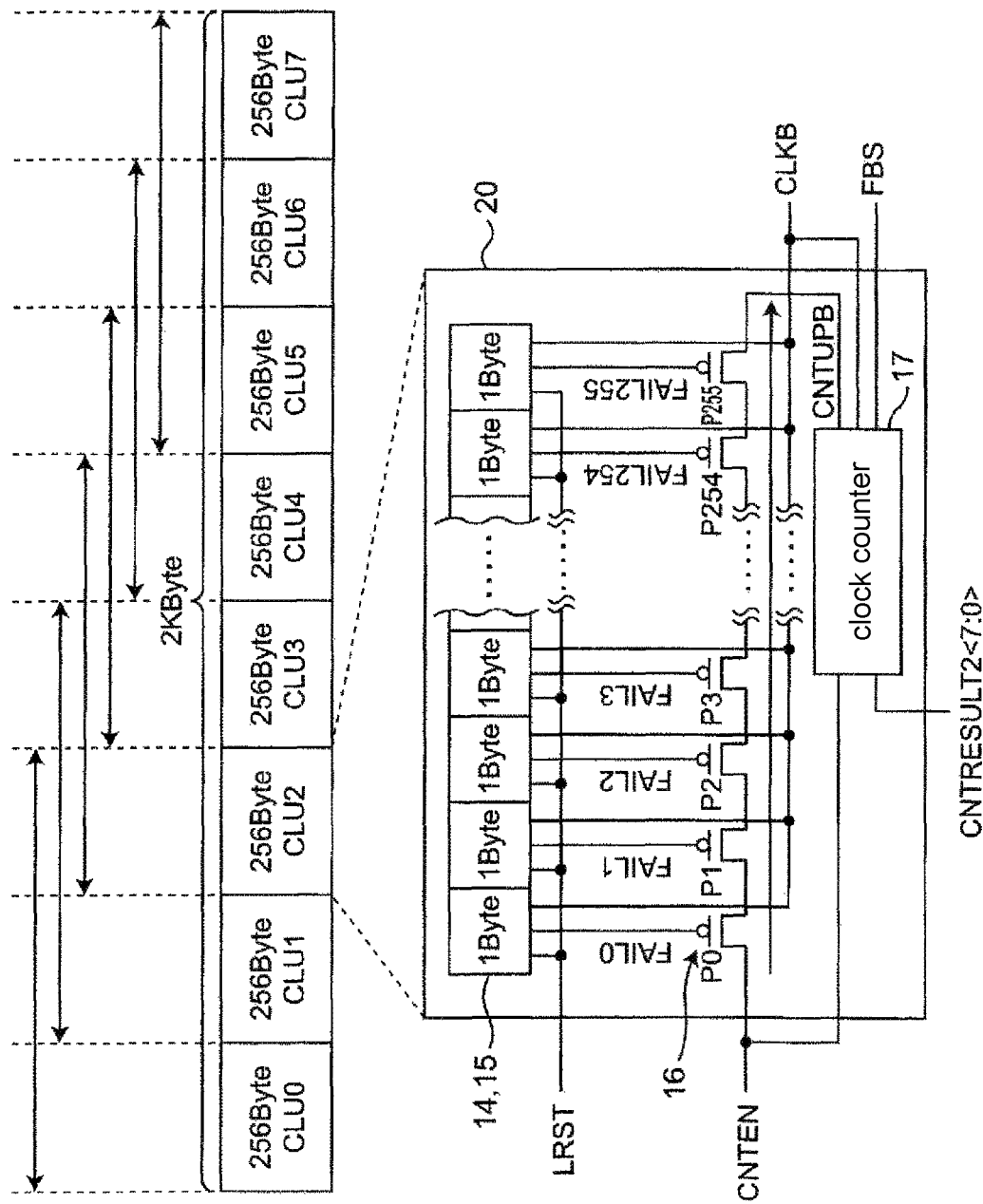
FIG. 3A is a circuit diagram showing a configuration example of a page buffer circuit 20 in FIG. 2.
Figure 3B:
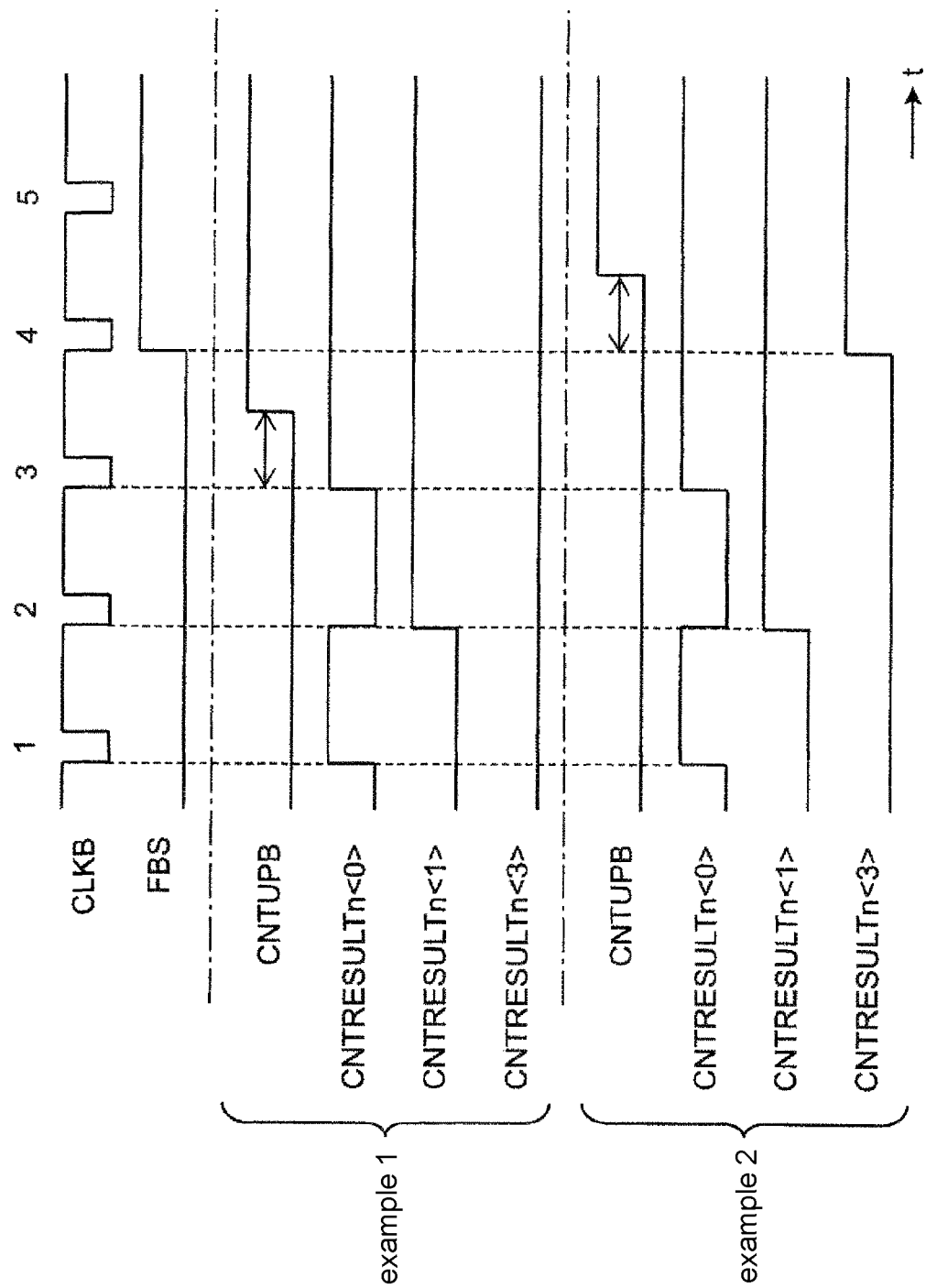
FIG. 3B is a timing chart of signals showing operations of the page buffer circuit 20 in FIG. 3A.
Figure 4:
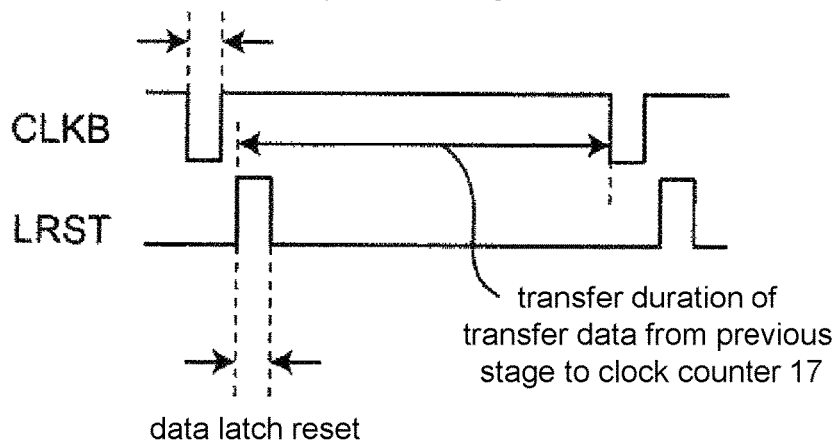
FIG. 4 is a diagram showing the operations of the page buffer circuit 20 in FIG. 3 and is a timing chart showing a transfer duration of transfer data from the previous stage and from a data latch reset toward a clock counter 17.

FIG. 3A is a circuit diagram showing a configuration example of the page buffer circuit 20 in FIG. 2, and FIG. 3B is a timing chart of signals showing operations of the page buffer circuit 20 in FIG. 3A. In addition, FIG. 4 is a diagram showing the operations of the page buffer circuit 20 in FIG. 3A, and is a timing chart showing a transfer duration of the transfer data from the previous stage and from a data latch reset toward the clock counter 17. FIG. 3A shows a configuration example of ECC32 bits/512 bytes which is a 2K-byte page buffer circuit 20. In this example, the page buffer circuit 20 is divided into eight segments for fail bit counting.

In FIG. 3A, the page buffer 14, the CR data latch 15 and a P-channel MOS transistor Pn of the data transfer circuit 16 are arranged for each byte, and CR data FAIL0-FAIL255 indicating a pass bit or fail bit is applied from the page buffer 14 to each gate of the MOS transistor Pn via the CR data latch 15. Herein, the CR data FAIL0-FAIL255 is at L-level in a case of pass bit and the corresponding P-channel MOS transistor Pn is turned on; on the other hand, the CR data FAIL0-FAIL255 is at H-level in a case of fail bit and the corresponding P-channel MOS transistor Pn is turned off. In the data transfer circuit 16, for example, 255 MOS transistors Pn (n=0, 1, 2, . . . , 255) are connected in series; a counting enable signal CNTEN is applied from one side of the series circuit, and a pulse of the counting-up signal CNTUPB is output from the other side after the clocks CLKB with a number corresponding to the fail number. That is, when the counting-up signal CNTUPB is changed from L-level to H-level, the clock number of the clocks CLKB counted by the clock counter 17 represents the fail number. Herein, as shown in FIG. 4, from the data latch reset using the CR data latch 15 till the next clock CLKB after a check of the transfer data from the previous stage based on the clocks CLKB, one clock CLKB corresponds to one fail bit (in FIG. 3A, a fail with respect to a 1-byte page buffer 14), and the fail number can be obtained based on the clock number counted by the clock counter 17. Besides, specific operations of the data transfer circuit 16 are described in detail with reference to FIG. 6-FIG. 14.

In FIG. 3A, for example, a fail bit set value FBS (an acceptable fail value) for test is input to the clock counter 17, counting data CNTRESULT2<7:0> of the clock counter 17 is output to the chip operation control circuit 18 when the fail counting value is larger than the fail bit set value FBS, and the operations of the clock counter 17 are stopped when the fail counting value is smaller than the fail bit set value FBS. Generally, an unnecessary counting can be suppressed and an increase in operation time can be prevented by setting the largest fail number of the specification value. On the other hand, the restriction is released during the test, and the counter keeps operating until all the fail bits in a target area are detected. That is, in the embodiment, if all bits of PB data are fail when the 256 page buffers 14 are connected, the clocking is performed 256 times at most.

FIG. 3B is a timing chart of the signals showing the operations of the page buffer circuit 20 in FIG. 3A. In the following, the fail bit set value FBS is described below.

In regard to the fail bit set value FBS, a mask signal is output from the CPU in the form of the pulse time of the set clock CLK+1, and the next clock CLK outputs an information signal from counting data NTRESULT0-2<7:0> regardless of counting. In a case of FIG. 8 described later, a 256-bit fail expression is required and thus the counting data NTRESULT0-2<7:0> is transmitted by an 8-bit bus for example. Herein, the bus width is determined by the specification of the non-volatile semiconductor storage device. For example, the bus width may be 5 bits when counting to 32 bits only. Accordingly, the fail bit set value FBS is set in this range.

Example 1 in FIG. 3B shows a case in which the fail number is smaller than the fail bit set value FBS, and Example 2 shows a case in which the fail number exceeds the fail bit set value FBS. Herein, there are three clocks in Example 1, and thus a 3-bit fail information signal is output. In addition, Example 2 shows a case of 4-bit fail, and the fail bit set value FBS is at H-level at the fourth clock of (n+1) when the fail bit set value FBS is set to 3 bits. At this time, it is judged that output values of the counting data CNTRESULTn<3:0> all become "1" when the CNTUPB is still at L-level, and the fail number exceeds an acceptable range or acceptable value of the fail bit set value FBS in a case of exceeding the current clock number that the chip operation control circuit (CPU) 18 has. If all sectors are in either one of the cases, stop occurrence of the clocks CLK and move to the next operation. Besides, herein, the fail bit set value FBS can also be set for each sector, but the bus width increases.

Furthermore, it is an example that the output values of the counting data CNTRESULTn<3:0> all become "1", and the output values may be transmitted on a dedicated line in this case.

Figure 3C:
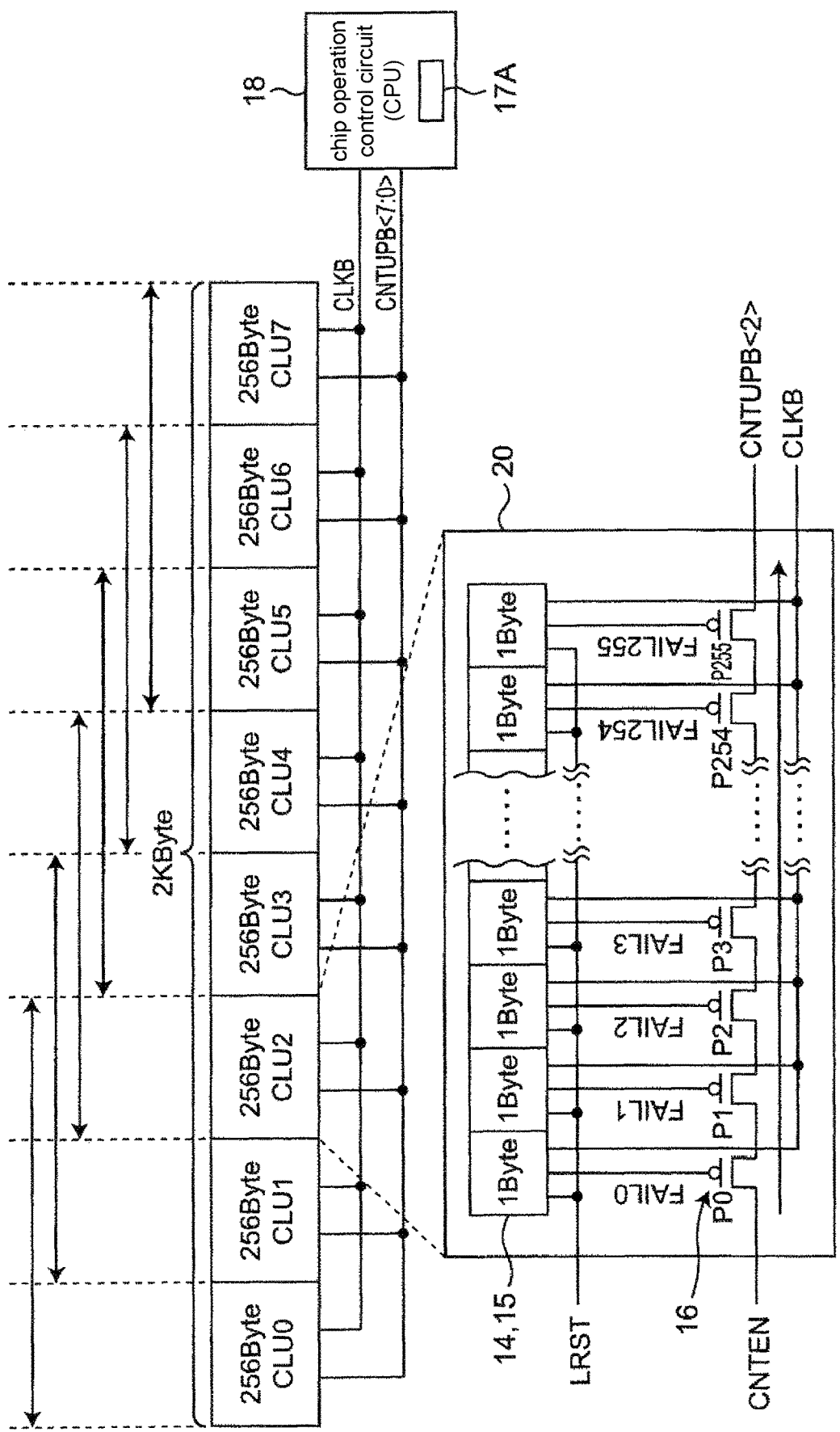
FIG. 3C is a circuit diagram showing a configuration example of a circuit including a page buffer circuit 20 of a variant.

FIG. 3C is a circuit diagram showing a configuration example of a circuit including a page buffer circuit 20 of a variant. In FIG. 3A, the clock counter 17 is arranged in the fail bit number counting circuit 19, but the disclosure is not limited hereto, as shown in FIG. 3C, the clock counter 17 may be arranged in the chip operation control circuit 18 configured by a CPU. In FIG. 3C, the fail bit set value FBS may be built in the chip operation control circuit (CPU) 18 as a clock counter 17A. The clock counter 17A operates until operations of all the sectors end, and stores the value at a timing that each counting data CNTUPB<7:0> is output. The operations afterward are similar to the circuit in FIG. 3A.

Besides, in the embodiments of FIG. 2-FIG. 14, the page buffer 14 of each stage processes 8-bit PB data, and connects 256 data transfer circuits 16 in series to process 256-byte PB data, but these numerical values are examples, and the disclosure is not limited hereto and may be other numerical values. In addition, in the embodiments, only one bit of the eight bits is latched by the CR data latch 15 of one stage and is calculated by the data transfer circuit 16, and the fail number for the 8-bit PB data can be determined for the first time by repeating a series of fail bit counting operations for eight times.

Figure 5:
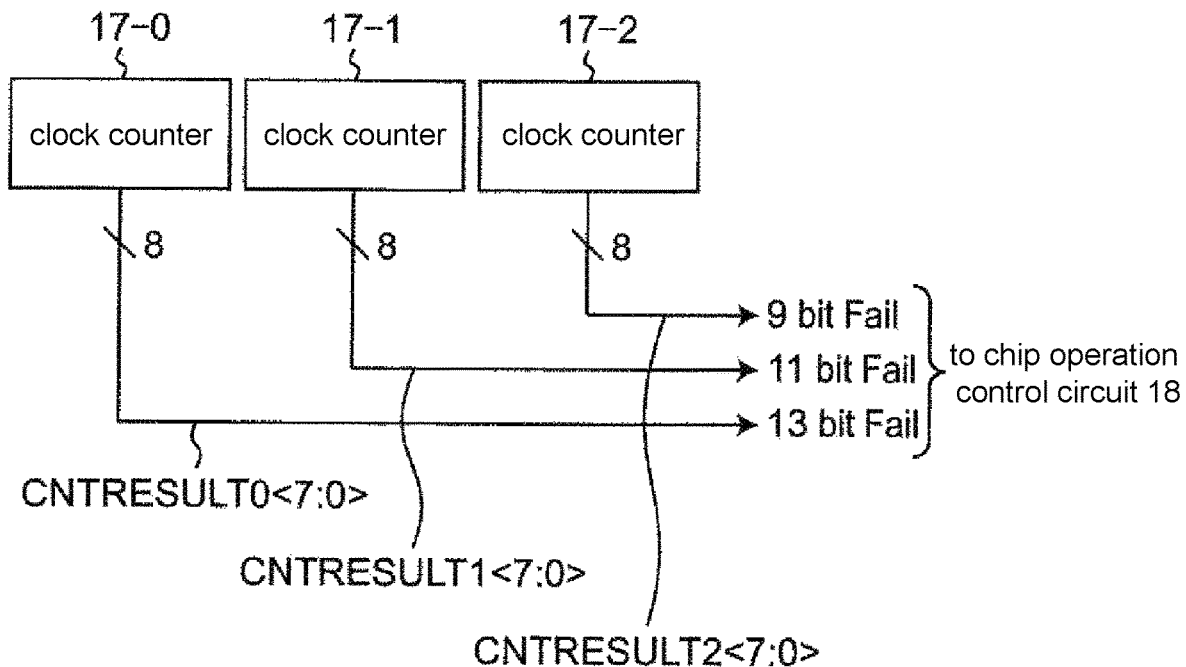
FIG. 5 is a block diagram showing a circuit which transfers data of a fail bit number of three clock counters 17-0 to 17-2 in FIG. 3.

FIG. 5 is a block diagram showing a circuit which transfers the data of the fail bit number from three clock counters 17-0 to 17-2 in FIG. 3A. In FIG. 5, the data CNTRESULT0-2<7:0> of the fail bit number from each of the clock counters 17-0 to 17-2 is transferred to the chip operation control circuit 18, and the total fail bit number is calculated. As is clear from FIG. 3A and FIG. 5, an acceptable fail number can be increased by calculating a sum of the fail number of three continuous blocks (the three clock counters 17-0 to 17-2). When a start address represented by the memory controller is flexible, it is unknown where a 512-byte unit being a specification is. Therefore, conventionally, it is set to be lower than the specification (for example, 32-bit) number in all blocks (that is, as described above, the circuit is configured by the analog operation method using the wiring connected in common with all the page buffers).

Figure 6:
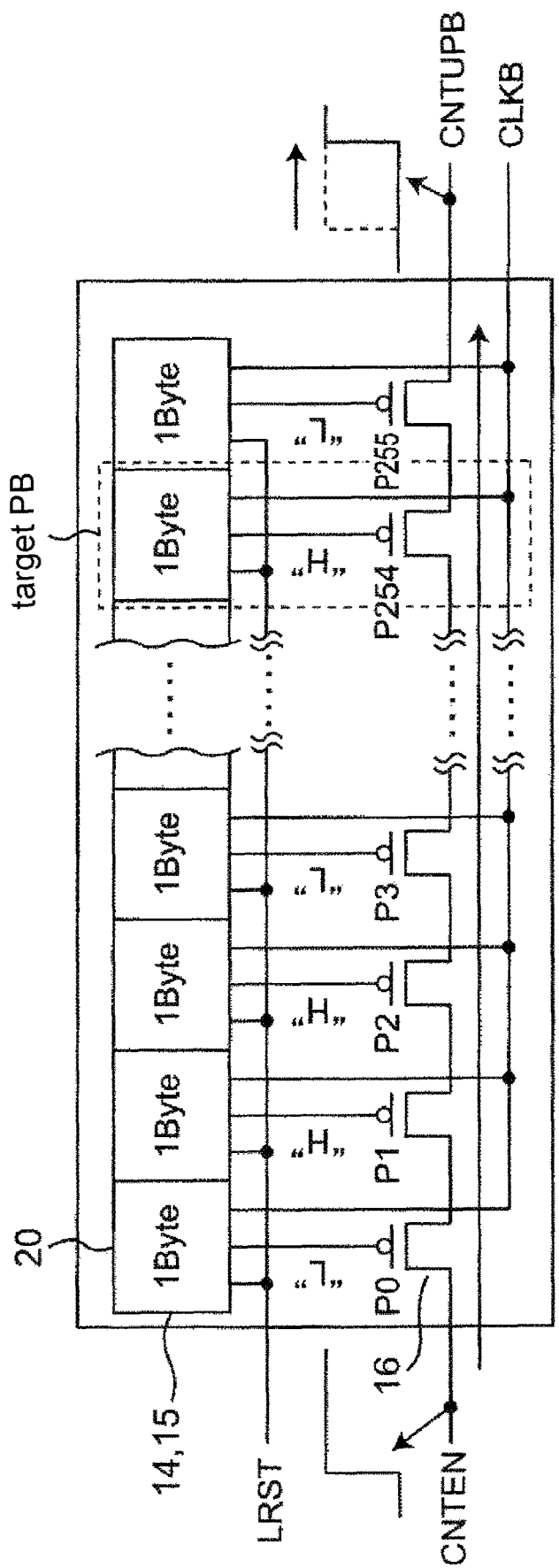
FIG. 6 is a circuit diagram showing a configuration example and an operation example of the page buffer circuit 20 in FIG. 3.

FIG. 6 is a circuit diagram showing a configuration example and an operation example of the page buffer circuit 20 in FIG. 3A. In the operation example of FIG. 6, when a fail signal at H-level (that is, a 3-bit fail bit) is applied to each gate of the MOS transistors P1, P2, P254, a target PB14 is set as the page buffer connected to the MOS transistor P254.

In FIG. 6, in an initial state before the counting enable signal CNTEN is input, the MOS transistors P1, P2, P254 are turned off, on the other hand, the rest MOS transistors P0, P3-P253, P255 are turned on. That is, when the counting enable signal CNTEN is input in this state, the counting enable signal CNTEN passes through the MOS transistor P0 and reaches a source of the MOS transistor P1 which is in the initial OFF state. As described below in detail, for each repeated clock CLKB, the counting enable signal CNTEN is finally output to the output terminal of the entire data transfer circuit 16 after the pulse of the counting enable signal CNTEN is stopped in the MOS transistor Pn being in the OFF state. Herein, when the output terminal changes from L (initial) level to H (already transferred) level, that is, the clock counting value when the counting-up signal CNTUPB at H-level is output represents the fail number.

Figure 7:
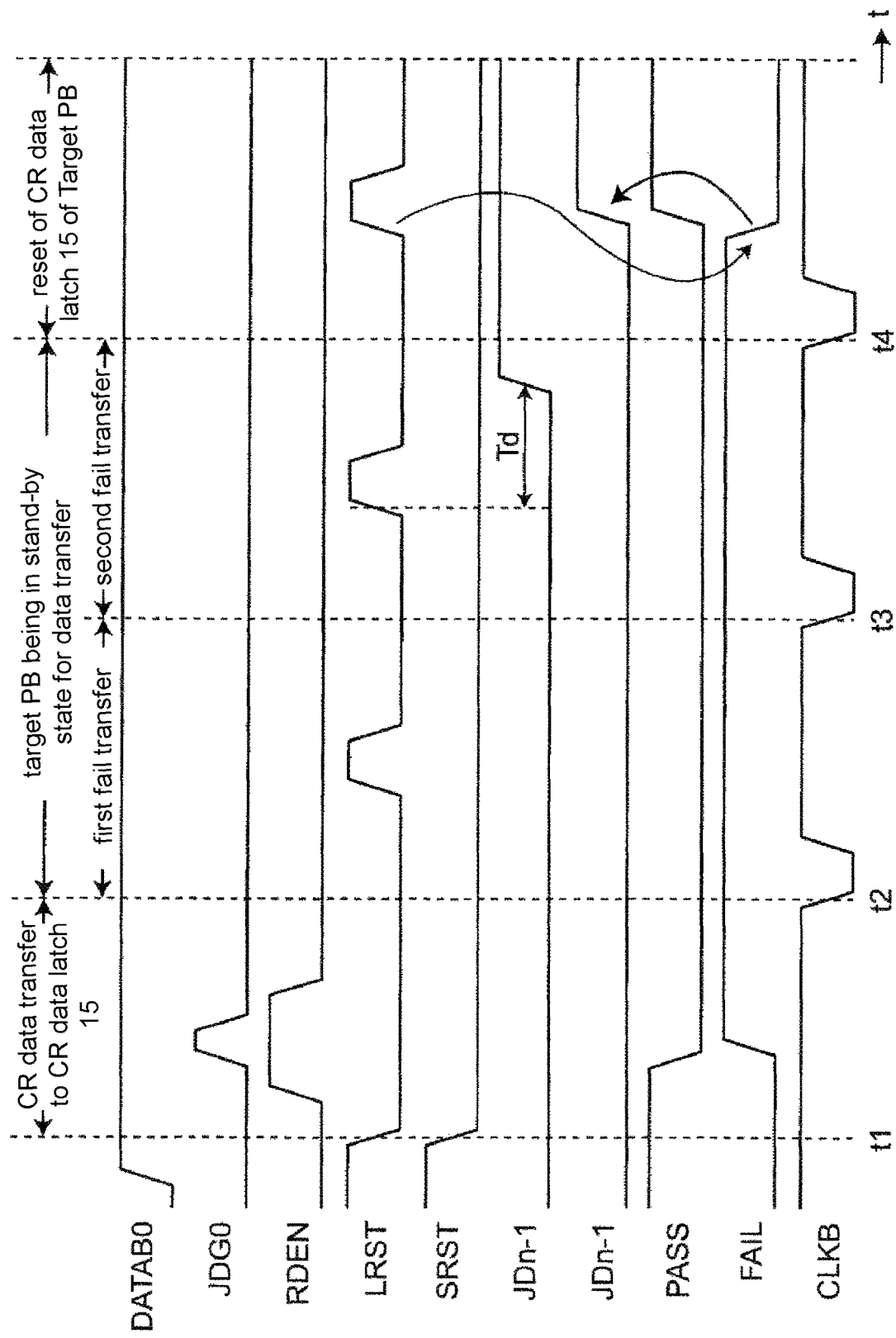
FIG. 7 is a timing chart showing an operation example of the page buffer circuit 20 in FIG. 6.

FIG. 7 is a timing chart showing operations in a case of the operation example of the page buffer circuit 20 in FIG. 6. Herein, the target PB14 is the page buffer connected to the MOS transistor P254 and is in a case of 3-bit fail bit.

During the time t1-t2 in FIG. 7, the CR data is latched from the page buffer 14 to the CR data latch 15. Then, the CR data of the MOS transistor P1 is transferred during the time t2-t3, and the CR data of the MOS transistor P2 is transferred during the time t3-t4. Besides, a transfer delay duration Td represents a delay duration of the CR data transfer, which occurs when the MOS transistor Pn of the previous fail bit is far away (in the operation examples of FIG. 6 and FIG. 7, the MOS transistors P3-P253 are turn on). Accordingly, the rate of the clocks CLKB is set based on this. Then, after the time t4, the reset of the CR data latch 15 of the target PB is executed, and finally the counting-up signal CNTUPB at H-level which is the output signal is output to the output terminal of the data transfer circuit 16 in three clocks CLKB. That is, the clock counting value of the clock counter 17 when the counting-up signal CNTUPB at H-level is output represents the fail number.

Figure 8:
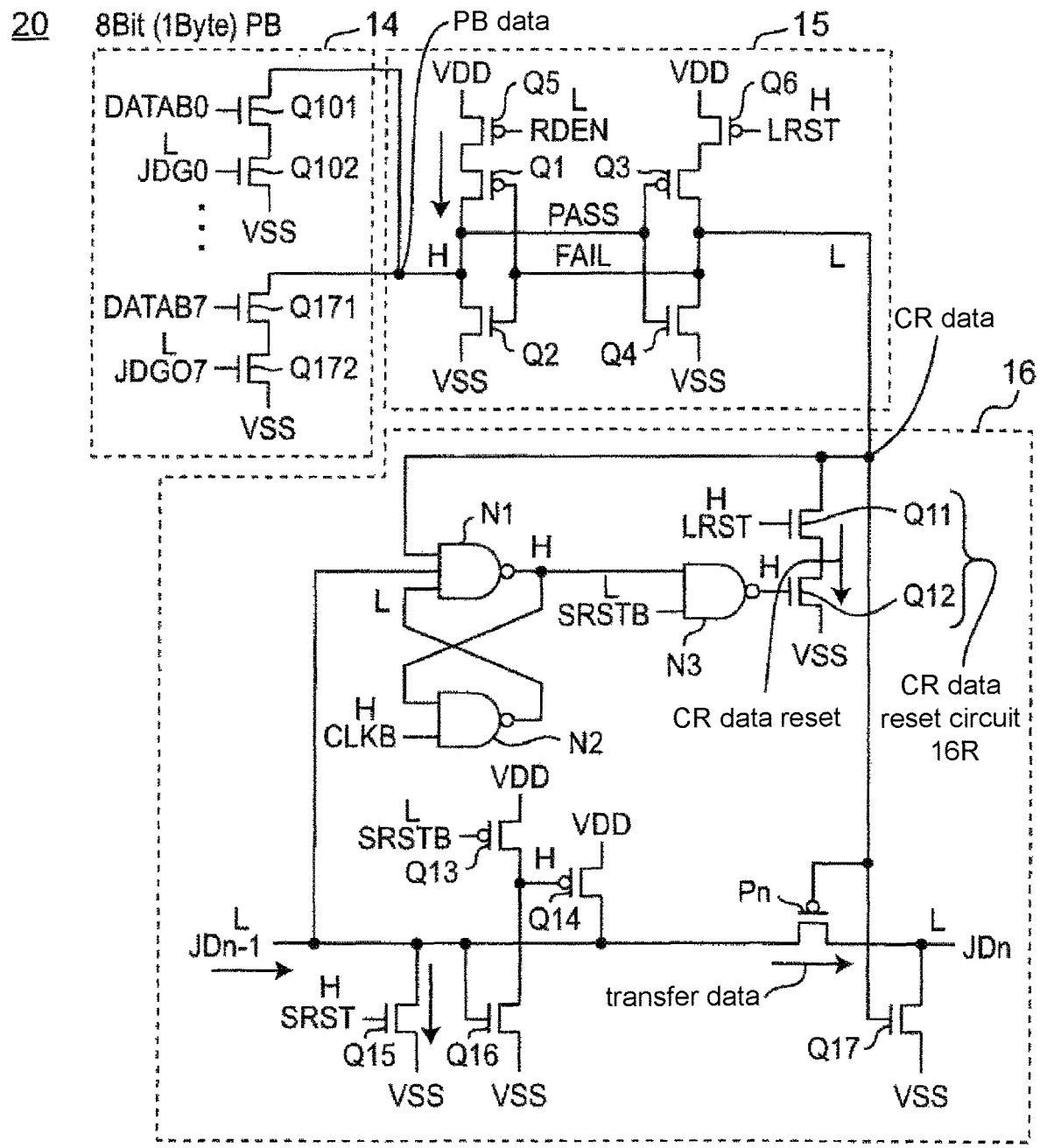
FIG. 8 is a circuit diagram showing signal levels of an initial state during CR data reset in the configuration of the page buffer circuit 20 in FIG. 3.

FIG. 8 is a circuit diagram showing signal levels of an initial state during the CR data reset in the configuration of the page buffer circuit 20 in FIG. 3A. Besides, in FIG. 8-FIG. 12, the parts of the CR data latch 15 and the data transfer circuit 16 with respect to a 1-byte (8-bit) page buffer 14 are shown.

In FIG. 8, the page buffer 14 is a 1-byte part of page buffer which is configured by connecting eight page buffer portions with a common column address in parallel. The page buffer 14 includes the MOS transistors Q101-Q172, and transfers 1-bit PB data of the page buffer 14 selected from one byte to the CR data latch 15 as an initial value for temporary storage; after that, the stored CR data changes based on the transfer data from the previous stage. The CR data latch 15 includes the MOS transistors Q1-Q6; herein, the MOS transistors Q1-Q4 constitute a latch circuit which temporarily latches the CR data, and the latched CR data is applied to the gate of the MOS transistor Pn of the data transfer circuit 16 and the gate of the MOS transistor Q17.

The data transfer circuit 16 includes the MOS transistors Q11-Q17 and NAND gates N1-N3. Herein, the MOS transistors Q11, Q12 constitute a CR data reset circuit 16R. The NAND gate N1 changes the state only when the input signals of FAIL, JDn−1 and CLK are all at H-level. The NAND gates N1, N2 constitute a latch circuit and latch the transfer data JDn−1 from the previous stage based on the clocks CLKB and the like. Besides, the MOS transistors Q11, Q12 operate when the latch circuit is reset or the results of data processing is reflected in the latch circuit.

In FIG. 8, JDn−1 represents the transfer data from the previous stage, and the terminal is connected to the transfer data transfer circuit 16 from the previous stage; besides, the initial stage of the data transfer circuit 16 is connected to the signal source of the counting enable signal CNTEN. In addition, as shown in Table 1 described later, JDn represents the transfer data to the next stage (as described above, the transfer data from the previous stage and the PBC data of self-stage (FIG. 11)) calculated based on the transfer data JDn−1 from the previous stage and the CR data of self-stage, and the terminal is connected to the data transfer circuit 16 of the next stage. Besides, the data transfer circuit 16 is connected to the clock counter 17 when being in the final stage (P255). The MOS transistor Q15 is arranged for an initial reset of the node of the transfer data Jn; Q13, Q14 and Q16 constitute a transfer voltage supply circuit, and the respective P-channel MOS transistors Pn of a plurality of data transfer circuits 16 are connected in series, and thus after the counting enable signal CNTEN at H-level is transferred by the CR data of pass bit so that reduction of transfer speed does not occur due to the increase in on-resistance of the MOS transistors, H-level of a prescribed voltage is supplied from the circuit, and thereby the above problem can be avoided and a high-speed data transfer can be achieved.

The P-channel MOS transistor Pn is a switch element which is turned on or off corresponding to the CR data latched by the CR data latch 15 of self-stage; and the P-channel MOS transistor Pn is turned on when the CR data is a pass bit (L-level) and is turned off when the CR data is a fail bit (H-level). Herein, the data transfer is stopped at a stage in which the CR data of fail bit exists, and the counting enable signal data is transferred to the output terminal of the transfer circuit 16 for once in a case that the CR data is fail bit at all stages. Besides, a reset signal SRST (the SRSTB is an inversion signal) is a signal for resetting the string of the MOS transistor Pn, and an upper latch circuit for turning on the P-channel MOS transistor Pn is reset by the CR data reset circuit 16R based on a reset signal LRST.

Herein, the operations of the data transfer circuit 16 in FIG. 8 are shown in the following Table 1.

Figure 12:
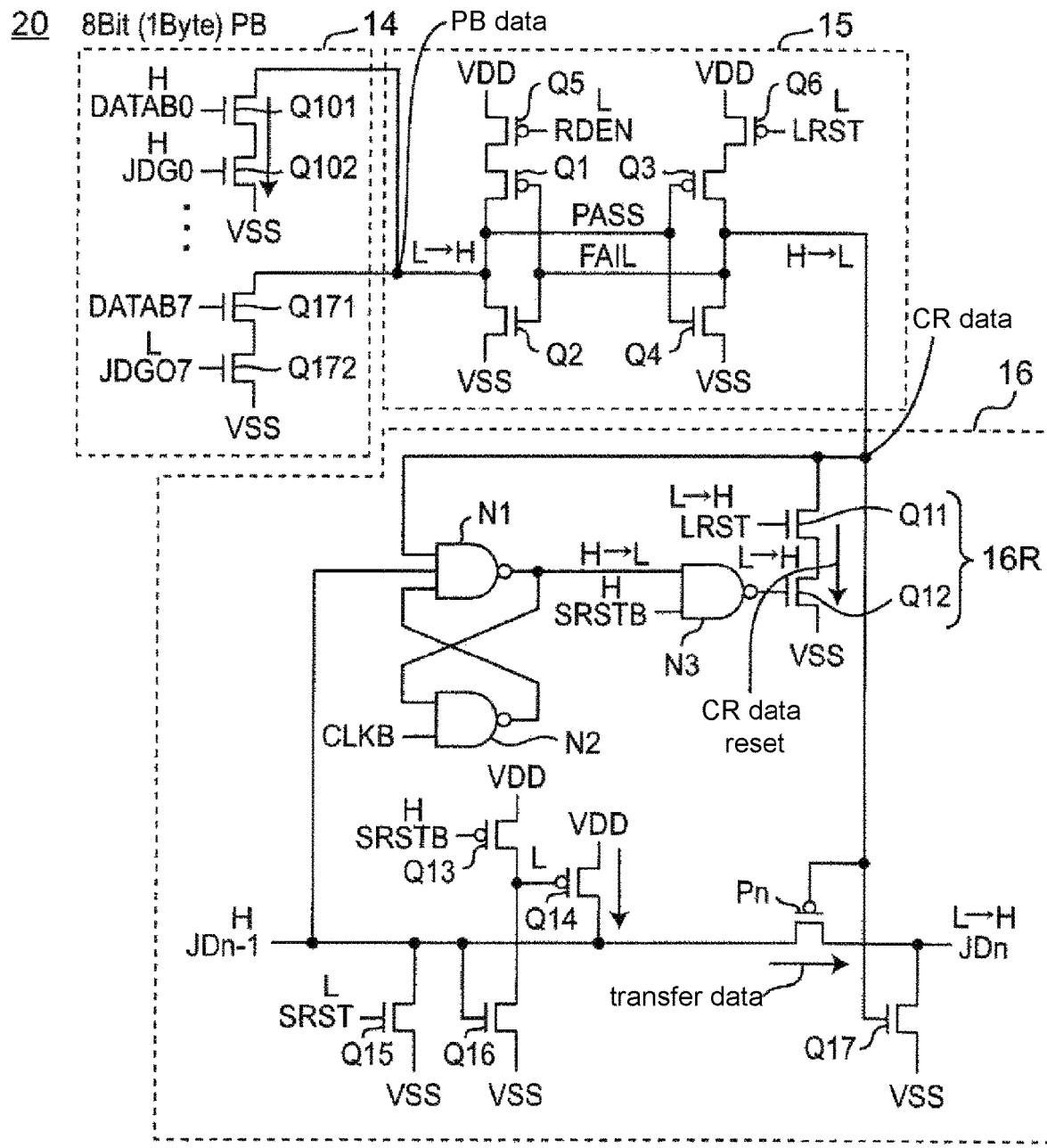
FIG. 12 is a circuit diagram showing signal levels when transfer data from previous stage is at H-level and CR data of self-stage is changed from fail bit to pass bit in the configuration of the page buffer circuit 20 in FIG. 3.

Besides, Variation 4 represents a state before the transition in FIG. 12. In addition, the meaning of each signal of the page buffer circuit 20 in FIG. 8 is as follows.

DATAB<7:0>: inversion data (pass bit=L, fail bit=H) of the reading data (PB data) of the page buffer 14

JDG<7:0>: a logic (control) signal for outputting the CR data; an operation of the signal is performed for each page buffer, and there is only one target page buffer in one operation RDEN: a signal for taking the PB data into the CR data latch 15, basically generated by an OR logic of the JDG<7:0> signal LRST: a signal operating at latch reset or when the transfer data JDn−1 from the previous stage is taken into the latch (N1, N2)

SRST, SRSTB: signals for resetting the string of the P-channel MOS transistor Pn CLKB: low enable clock, used for counting the fail number JDn−1: transfer data from the previous stage JDn: transfer data based on the transfer data from the previous stage and the CR data of self-stage;

the JDn−1 directly becomes JDn in an initial state and when being pass bit

Figure 9:
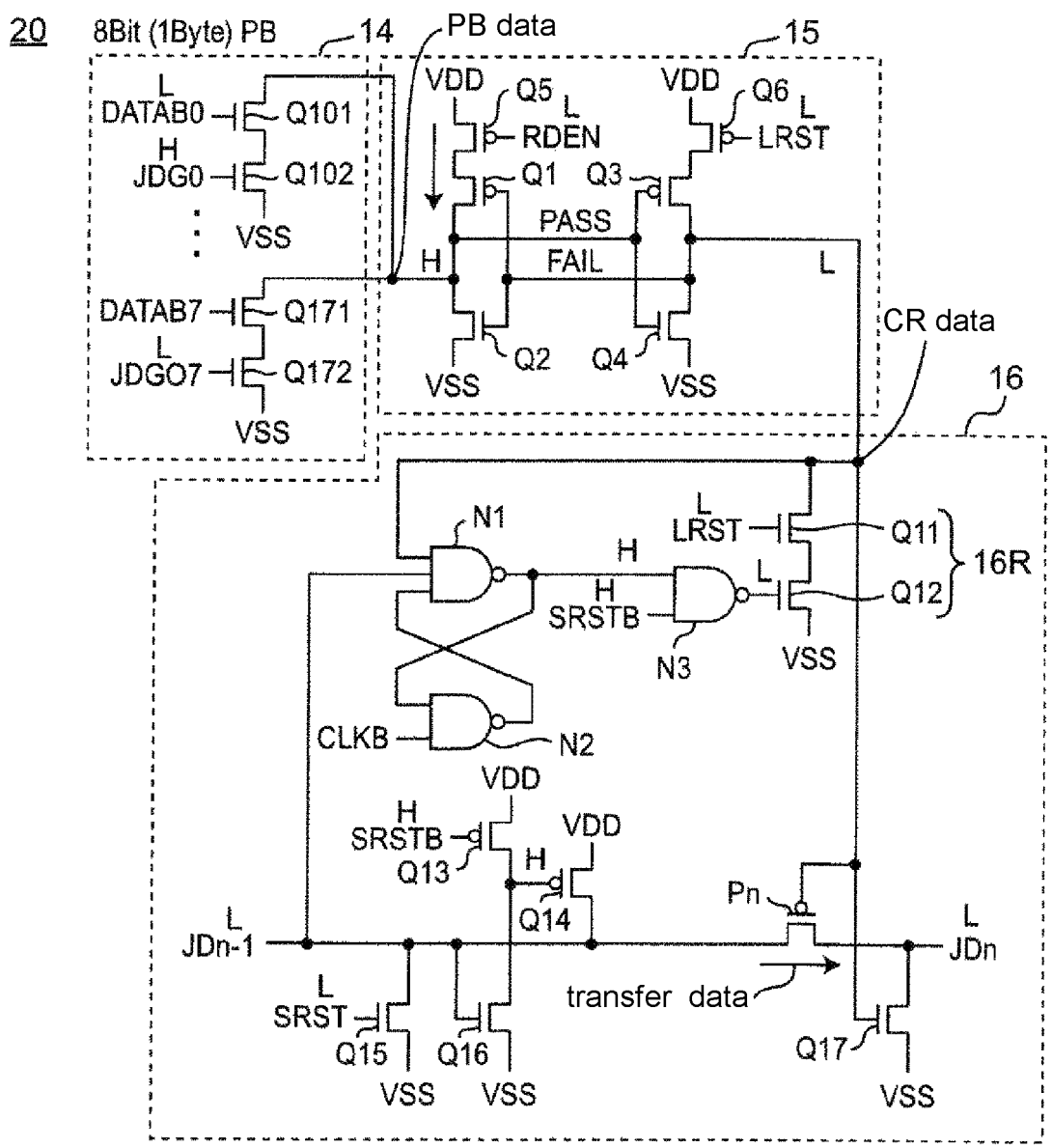
FIG. 9 is a circuit diagram showing signal levels when CR data of self-stage is a pass bit and transfer data from previous stage is at L-level in the configuration of the page buffer circuit 20 in FIG. 3.

FIG. 9 is a circuit diagram showing signal levels when the CR data of self-stage is a pass bit and the transfer data from the previous stage is at L-level in the configuration of the page buffer circuit 20 in FIG. 3. In addition, FIG. 10 is a circuit diagram showing signal levels when the CR data of self-stage is a pass bit and the transfer data from the previous stage is at H-level in the configuration of the page buffer circuit 20 in FIG. 3.

Figure 10:
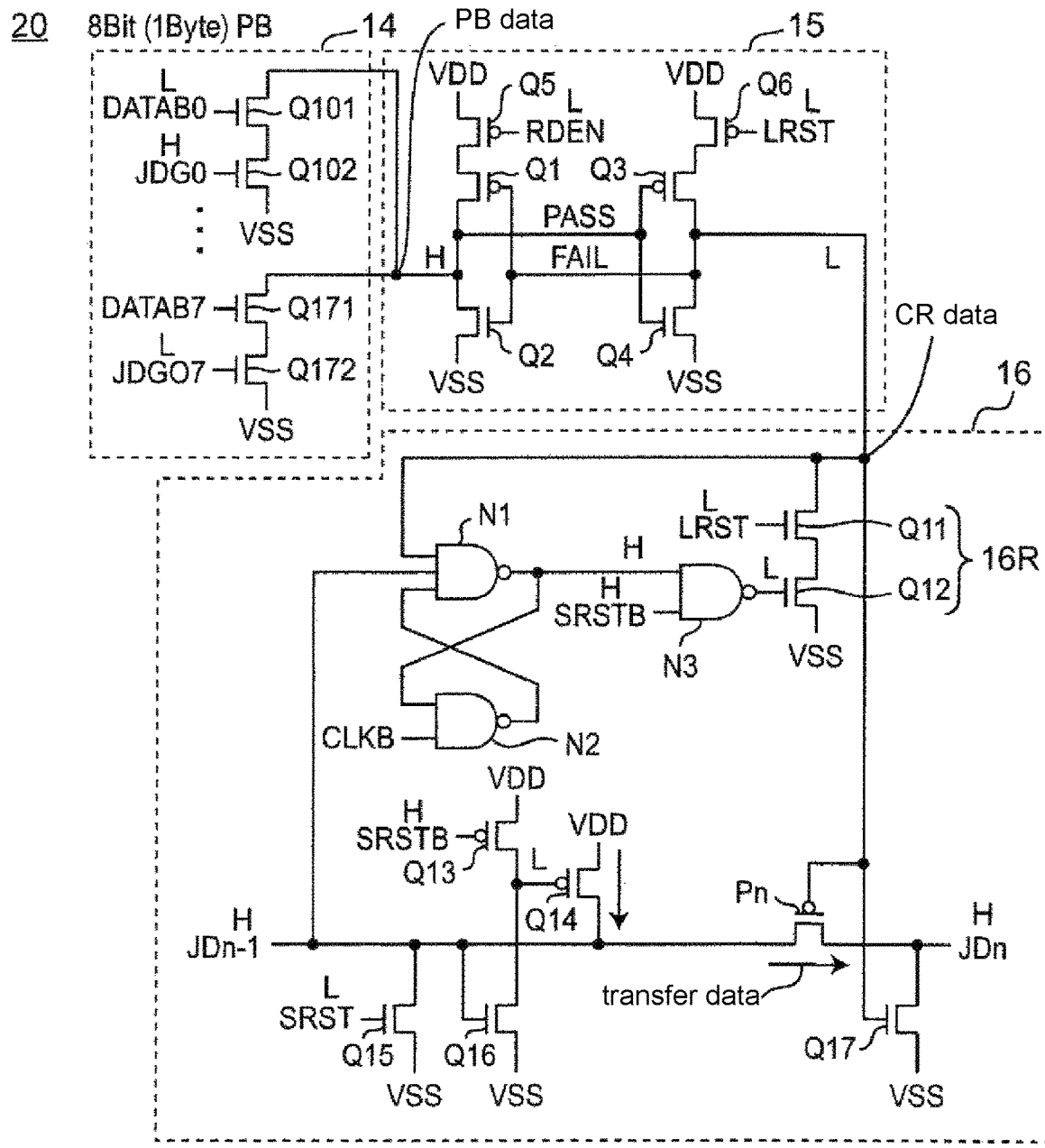
FIG. 10 is a circuit diagram showing signal levels when CR data of self-stage is a pass bit and transfer data from previous stage is at H-level in the configuration of the page buffer circuit 20 in FIG. 3.

As shown in FIG. 9 and FIG. 10, when the CR data of self-stage is a pass bit, the transfer data of the previous stage is directly transferred to the next stage regardless of the state of the CR data of the previous stage and the state of the clock CLK. For example, when all the latched PB data is a pass bit, the data transfer is completed at once till the final stage regardless of the signal level of the clock CLK when the counting enable signal CNTEN is at H-level. At this time, the MOS transistors Q15, Q16 constituting the transfer voltage supply circuit (the power supply circuit) are also sequentially turned on, and thus a transfer speed reduction caused by voltage drop does not occur.

Figure 11:
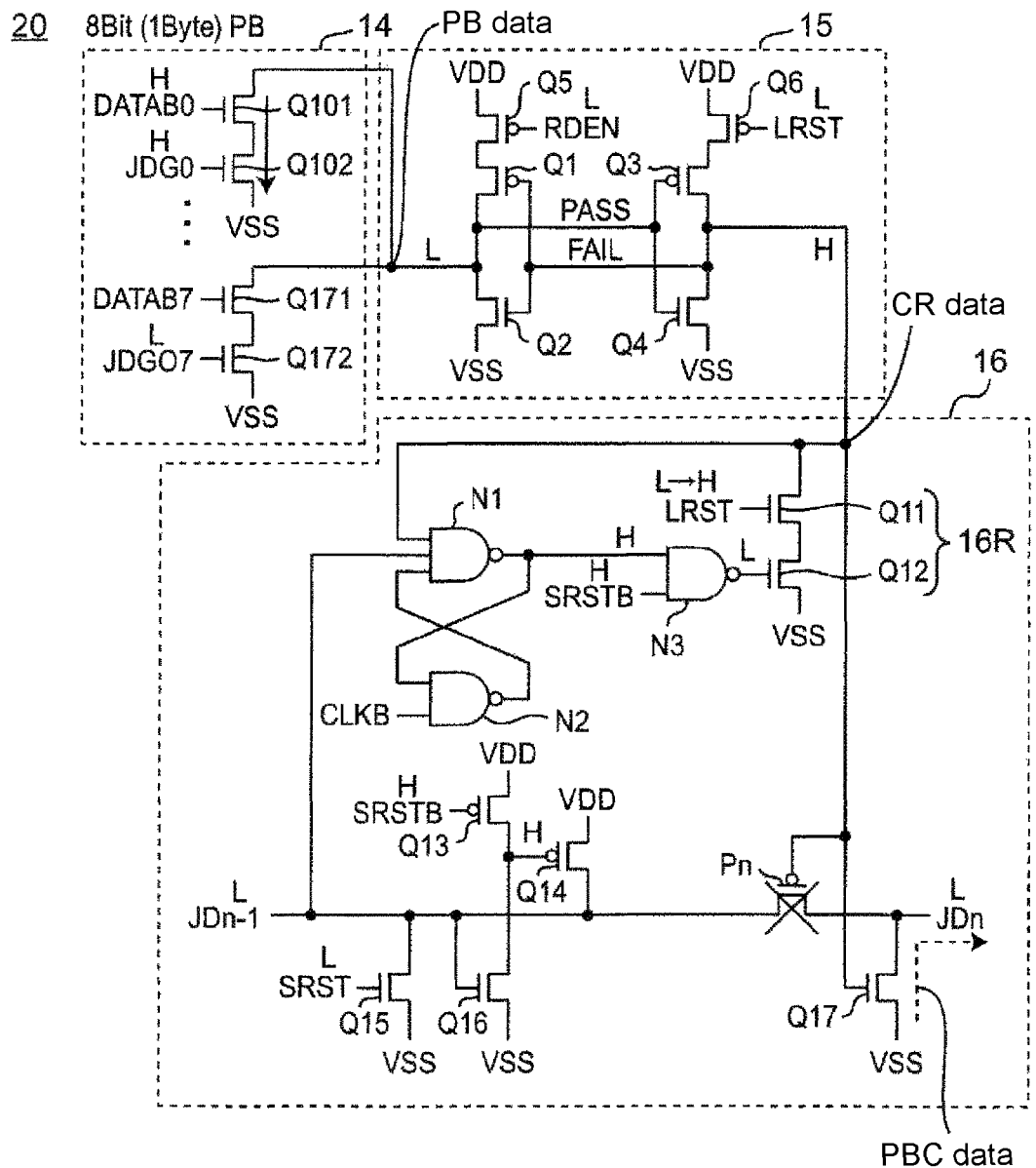
FIG. 11 is a circuit diagram showing signal levels when CR data of self-stage is a fail bit and transfer data from previous stage is at L-level in the configuration of the page buffer circuit 20 in FIG. 3.

FIG. 11 is a circuit diagram showing signal levels when the CR data of self-stage is a fail bit and the transfer data from the previous stage is at L-level in the configuration of the page buffer circuit 20 in FIG. 3A. In addition, FIG. 12 is a circuit diagram showing signal levels when the transfer

TABLE 1

| Variation (corresponding diagram) | Transfer data JDn-1 from the previous stage (level of JDn-1) | CR data of self-stage (PASS/FAIL level of CR latch data of CR data latch 15) | Operations of output data and the like based on transfer data JDn-1 from the previous stage and CR data of self-stage (level of transfer data JDn to the next stage) |
|---|---|---|---|
| 1 (FIG. 8-FIG. 9) | Fail (L-level) | Pass (H-level/L-level) | holding PB data of initial value by CR data reset and transferring transfer data of the previous stage (L-level) |
| 2 (FIG. 11) | | Fail (L-level/H-level) | Turning off Pn and transmitting PBC data (L-level) |
| 3 (FIG. 10) | Pass (H-level) | Pass (H-level/L-level) | Transferring transfer data of the previous stage (H-level) |
| 4 (FIG. 12) | | Fail (L-level/H-level) | Turning off Pn (L-level) | data from the previous stage is at H-level and the CR data of self-stage is changed from fail bit to pass bit in the configuration of the page buffer circuit 20 in FIG. 3A.

As shown in FIG. 11, when the CR data of self-stage is a fail bit, the CR data is rewritten to the transfer data; on the other hand, only when the CR data of self-stage is a fail bit and the transfer data from the previous stage is at L-level, the PBC data which is data corresponding to the PB data is transferred from the MOS transistor Q17 to the next stage. That is, when the PB data is a fail bit, from the fact that PASS=L in the CR data latch 15 and DATAB is inversion data of the PB data, the polarities of the data are definitely the same, and thus the PB data can be transmitted to the transfer string in a pseudo manner by the fail bit (initial CR data). In this embodiment, the pseudo PB data is referred to as PBC.

However, as shown in FIG. 12, when the transfer data from the previous stage is at H-level, the state of the clock CLKB=L is used as a trigger for data processing, and the reset signal LRST is set to H level during the state of the clock CLKB=L, and thereby the CR data which is the latched PB data is inverted and the CR data of the CR data latch 15 is rewritten into a pass bit. Accordingly, the P-channel MOS transistor Pn is turned on and the transfer data from the previous stage is transferred to the next stage. The transfer data is transferred till a stage of fail bit after the next stage, and the transfer data is transferred till the final stage at once if there is no fail bit. Besides, Variation 4 in Table 1 represents a state before the transition in FIG. 12.

Figure 13:
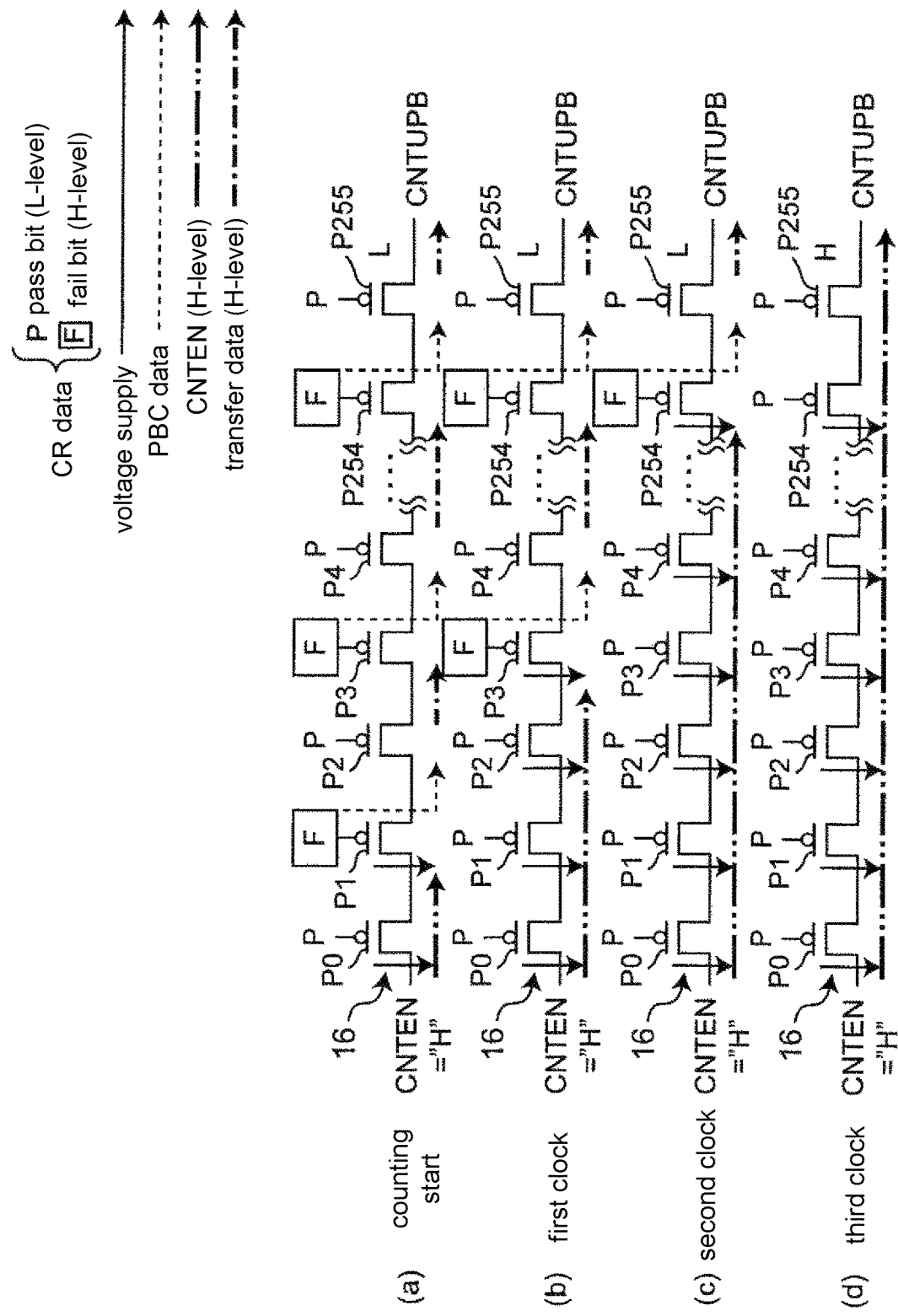
FIG. 13 is a circuit diagram showing operation examples of a data transfer circuit 16 of the page buffer circuit 20 in FIG. 3.

FIG. 13 is a circuit diagram showing operation examples of the data transfer circuit 16 of the page buffer circuit 20 in FIG. 3A. In addition, FIG. 14 is a timing chart showing a data transfer duration Ttr in the data transfer circuit 16 in FIG. 13.

Figure 14:
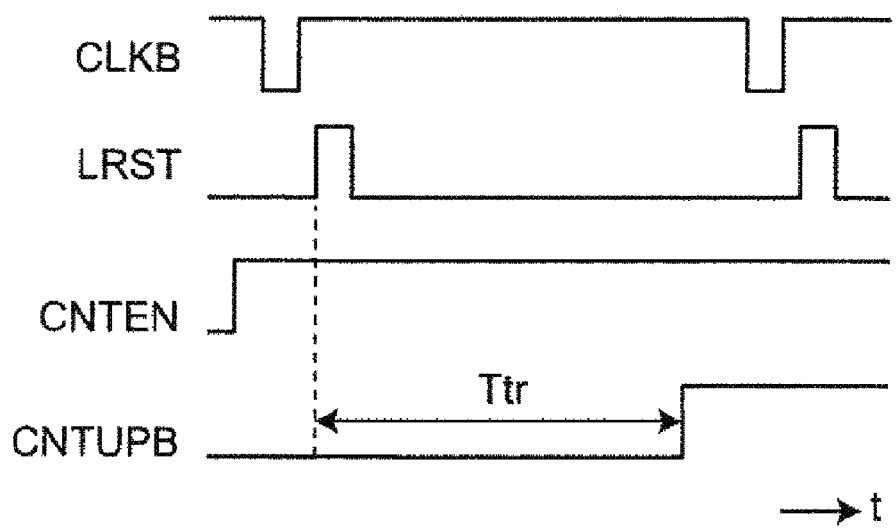
FIG. 14 is a timing chart showing a data transfer duration Ttr in the data transfer circuit 16 in FIG. 3.

FIG. 13 shows a case of 3-bit fail bit; in FIG. 14, the CR data of one fail bit can be rewritten and the transfer data from the previous stage can be transferred in the data transfer duration Ttr, and the counting enable signal CNTEN at H-level can be transferred till the final stage at three clocks CLKB. That is, the counting enable signal CNTEN at H-level from the output terminal of the data transfer circuit 16 becomes a counting-up signal CNTUPB (an inversion of counting-up, referring to an inversion counting continuation signal), and the clock counter 17 can determine that the clock number counted when the counting-up signal CNTUPB is detected is the fail bit number.

As described above, the data transfer circuit 16 in which the P-channel MOS transistors Pn are connected in series is used to transfer the CR data based on the clocks CLKB, and the clock CLK number counted when the counting enable signal CNTEN at H-level input to the data transfer circuit 16 reaches the clock counter 17 is counted as the fail bit number. Accordingly, the fail bit number of the CR data can be counted with higher accuracy and higher speed compared with the conventional technology.

Variant

Figure 15:
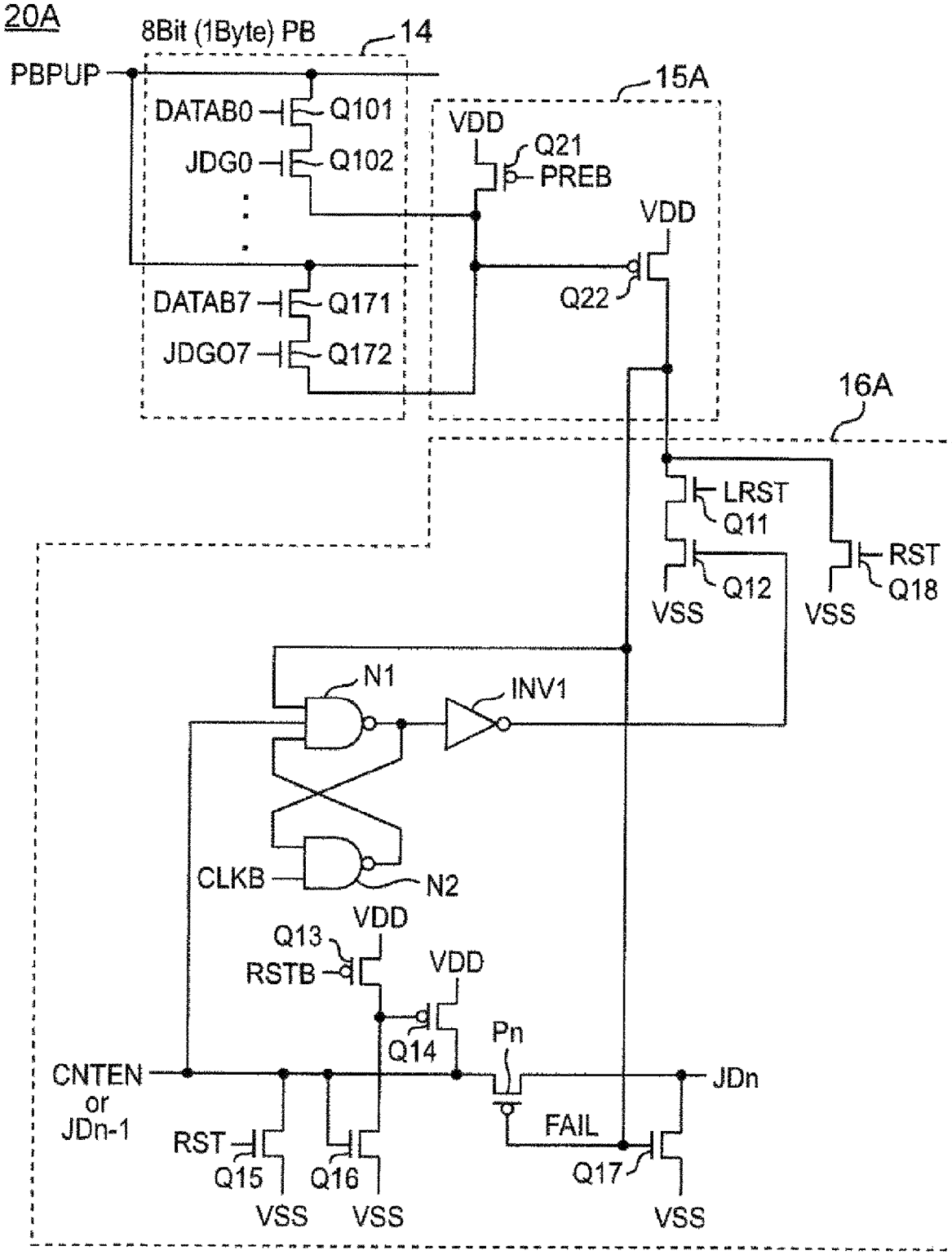
FIG. 15 is a circuit diagram showing a configuration example of a page buffer circuit 20A of a variant.

FIG. 15 is a circuit diagram showing a configuration example of a page buffer circuit 20A of a variant. The page buffer circuit 20A in FIG. 15 differs from the page buffer circuit 20 in FIG. 8 in the following points.

(1) Instead of the CR data latch 15, a CR data transfer circuit 15A is included.
(2) Instead of the data transfer circuit 16, a data transfer circuit 16A is included.

The different points are described below in detail.

In FIG. 15, the CR data transfer circuit 15A includes MOS transistors Q21-Q22. Compared with the CR data latch 15, the CR data transfer circuit 15A does not have the latch function and only transfers CR data. Along with the change of the circuit, the circuit parts of the MOS transistors Q11-Q12 of the data transfer circuit 16 is replaced with the circuit parts of the MOS transistors Q11, Q12, Q18, and the NAND gate N3 is replaced with an inverter INV1.

The page buffer circuit 20A configured as above has similar effects except that the data transfer circuit 16A only has the function of transferring the CR data.

In the above embodiments, the P-channel MOS transistors Pn are connected in series in the data transfer circuit 16, but the disclosure is not limited hereto, and the logics of pass bit and fail bit may be inverted to connecting N-channel MOS transistors in series. In addition, the MOS transistor Pn may be a switch element that can be controlled to be turned on or turned off by the control terminal.

In the above embodiments, the NAND type flash memory is described, but the disclosure is not limited hereto and can be used in a NOR type flash memory or other various non-volatile semiconductor storage devices.

A 1-byte page buffer portion is used in the page buffer circuit 20 in FIG. 3A, and a 1-byte page buffer portion is used in the page buffer circuit 20 in FIG. 8-FIG. 12, but the disclosure is not limited hereto, and the page buffer portion connected to each MOS transistor Pn may be a page buffer with a prescribed capacity.

INDUSTRIAL APPLICABILITY

As described above in detail, according to the fail bit number counting circuit of the disclosure, a fail bit number counting circuit capable of operating with higher accuracy and higher speed compared with the conventional technology can be provided.

DESCRIPTION OF THE SYMBOLS 10 memory cell array
12 row control circuit
13 high voltage generation circuit
14 page buffer
15 CR data latch
15A CR data transfer circuit
16, 16A data transfer circuit
16R CR data reset circuit
17, 17A, 17-0, 17-1, 17-2 clock counter
18 chip operation control circuit
20 page buffer circuit
21 input-output terminal
22 data input-output buffer
30 column control circuit
201 page buffer
202 inverter
203 current source
INV1 inverter
N1-N3 NAND gate
Pn, P0-P255 P-channel MOS transistor
Q1-Q172, Q201-Q206 MOS transistor
T1 detection point

What is claimed is:
1. A fail bit number counting circuit for an non-volatile semiconductor storage device, comprising:
a non-volatile memory cell array consisting of a plurality of memory cells; and a control circuit which controls writing of data consisting of a plurality of segments into the memory cell array via a page buffer and reading of data from the memory cell array via the page buffer, and counts the number of fail bits generated during the writing or the reading;

wherein the page buffer is divided into a plurality of page buffer portions with a prescribed capacity for outputting calculation result data indicating a pass bit or fail bit;

the fail bit number counting circuit includes a data transfer circuit configured by a series circuit in which a plurality of switch elements that are turned on for the calculation result data indicating a pass bit from each of the page buffer portions and turned off for the calculation result data indicating a fail bit is connected in series;

the control circuit inputs a counting enable signal to one input terminal of the data transfer circuit, and sequentially transfers the counting enable signal till the next switch element being turned off via the series circuit corresponding to a clock with a prescribed cycle; and the fail bit number counting circuit includes a clock counter, by which the number of the clocks till the counting enable signal reaches the other output terminal of the data transfer circuit after the counting enable signal is input to one input terminal of the data transfer circuit is counted as a fail bit number.

2. The fail bit number counting circuit according to claim 1, wherein the clock counter is built in an arithmetic circuit for controlling a chip operation of the non-volatile semiconductor storage device.

3. The fail bit number counting circuit according to claim 1, wherein the data transfer circuit transmits data corresponding to the data of the page buffer to the data transfer circuit of the next stage when transfer data from the data transfer circuit of the previous stage is a fail bit and the calculation result data indicates a fail bit.

4. The fail bit number counting circuit according to claim 1, further comprising a calculation result data latch which temporarily latches the calculation result data indicating a pass bit from each of the page buffer portions and then transfers the calculation result data to a control terminal of each of the switch elements.

5. The fail bit number counting circuit according to claim 1, comprising a plurality of clock counters which respectively correspond to a plurality of page buffers, wherein the control circuit calculates the number of fail bits of the plurality of page buffers on the whole by adding the number of fail bits from the plurality of clock counters.

6. The fail bit number counting circuit according to claim 1, wherein each of the switch elements is a P-channel MOS transistor.

7. The fail bit number counting circuit according to claim 1, wherein the data transfer circuit further comprises a power supply circuit which applies a prescribed voltage to the series circuit for transferring the calculation result data so that reduction of transmission speed does not occur due to an increase in on-resistance of the plurality of switch elements.

8. A non-volatile semiconductor storage device, comprising the fail bit number counting circuit according to claim 1.

* * * * *